United States Patent [19]
Porter et al.

[11] Patent Number: 6,026,031
[45] Date of Patent: Feb. 15, 2000

[54] RELAXED WRITE TIMING FOR A MEMORY DEVICE

[75] Inventors: John D. Porter; William N. Thompson, both of Meridian; Larren G. Weber, Caldwell, all of Id.

[73] Assignee: Micron Technology, Inc., Boise, Id.

[21] Appl. No.: 09/078,069

[22] Filed: May 13, 1998

[51] Int. Cl.[7] ................................................ G11C 16/04
[52] U.S. Cl. .............................. 365/189.05; 365/189.08; 365/191.233
[58] Field of Search ...................... 365/189.05, 189.08, 365/191, 233; 711/169

[56] References Cited

U.S. PATENT DOCUMENTS

5,581,512  12/1996  Kitamura .................................. 365/233
5,752,270   5/1998  Wada ....................................... 711/169

*Primary Examiner*—David Nelms
*Assistant Examiner*—Hoai V. Ho
*Attorney, Agent, or Firm*—Fletcher, Yoder & Van Someren

[57] ABSTRACT

A memory device provides a relaxed write timing scheme that improves access time. The address and/or the data is set up to the memory array during a previous write cycle so that the next write cycle can proceed without delays produced in delivering the address and/or the data to the array during the write cycle in which the data is to be written to the array.

6 Claims, 7 Drawing Sheets

RELAXED WRITE TIMING FOR A MEMORY DEVICE

BACKGROUND OF THE INVENTION

1. Field of the Invention

The present invention relates generally to memory devices and systems which use memory devices and, more particularly, to the structure and operation of a memory device that uses relaxed write timing.

2. Description of the Related Art

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a wide variety of different memory devices available for use in microprocessor-based systems. The type of memory device chosen for a specific function within a microprocessor-based system depends largely upon what features of the memory are best suited to perform the particular function. One common type of memory device is known as a random access memory (RAM). As the name implies, any memory location in a RAM may be accessed individually to store information or to read information. As a further advantage, the memory cells used in most RAMs are capable of handling millions of write, read, and erase cycles, commonly referred to as programming cycles, without failure.

The two most common and versatile types of RAMs are the dynamic RAM (DRAM) and the static RAM (SRAM). A memory cell of a typical DRAM is formed by a single capacitor and a single transistor. Digital information is stored in the form of a charge on the capacitor, and the transistor permits the capacitor to be accessed for charge storage (writing) or charge detection (reading). Because of this simple memory cell configuration, DRAM memory cells may be densely packed together to form single chip memories having extremely high capacities, currently approaching one gigabyte. Disadvantageously, however, the charge on the memory capacitors tends to diminish rather quickly, requiring periodic refresh cycles. Also, because the stored charge is quite small, relatively complex signal detection and amplification circuitry is used to access the memory cells, thus providing somewhat slower access times than comparable SRAMs.

The primary advantages of SRAMs as compared to DRAMs are high speed and ease of use. To understand the advantages and disadvantages, it should first be understood that a typical SRAM memory cell includes a four transistor-latch that stores information and two transistors that permit access for reading or writing information in the latch. The main disadvantage relates to the size of the memory cell required by the six transistors. Because of their size, SRAM memory cells cannot be packed as densely as DRAM memory cells. Therefore, the capacity of a single chip SRAM has not yet, and will probably never, reach the capacity of a single chip DRAM.

However, the superior performance of SRAMs derives from the larger signal stored in the latch and the absence of a need to refresh the stored information. As a result, the signal detection and amplification circuitry used in SRAMs is far simpler, easier to use, and offers higher access speeds. In regard to the access speeds, most current SRAM designs typically exhibit access times of a few nanoseconds to a few tens of nanoseconds. Even though such speeds are superior to most other comparable memories that are currently commercially available, even greater speeds would certainly be desirable.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a method of accessing a memory array of a memory device. The method includes the steps of: (a) reading an address into the memory device during a first write cycle; (b) reading data into the memory device during a second write cycle; and (c) delivering the address and the data to the memory array during a third write cycle.

In accordance with another aspect of the present invention, there is provided a method of accessing a memory array of a memory device. The method includes the steps of: (a) setting up an address for delivery to the memory array during a first and a second write cycle; (b) setting up data for delivery to the memory array during the second write cycle; and (c) delivering the address and data to the memory array during a third write cycle.

In accordance with still another aspect of the present invention, there is provided a method of accessing a memory array of a memory device. The method includes the steps of: (a) generating a write clock signal in response to a system clock signal and a write signal; (b) generating a write pulse signal in response to the write clock signal; (c) generating an end-of-write signal in response to the write clock signal and the write pulse signal; (d) storing an address in a first address register in response to the system clock signal; (e) transferring the address from the first address register to a second address register in response to the write clock signal; (f) transferring the address from the second address register to a third address register in response to one of the end-of-write signal and the write clock signal; (g) delivering the address from the third address register to the memory array in response to the write pulse signal; (h) storing data in a first data register in response to the write clock signal; (i) transferring the data from the first data register to a second address register in response to one of the end-of-write signal and the write clock signal; and (j) transferring the data from the second address register to a write driver in response to the write pulse signal, the write driver delivering the data to the memory array.

In accordance with yet another aspect of the present invention, there is provided a memory device. The memory device includes a write clock signal generator that delivers a write clock signal in response to a system clock signal and a write signal. A write pulse generator delivers a write pulse signal in response to the write clock signal, and an end-of-write signal generator delivers an end-of-write signal in response to the write clock signal and the write pulse signal.

A first address register stores an address in response to the system clock signal. A second address register is coupled to the first address register. The first address register transfers the address to the second address register in response to the write clock signal. A third address register is coupled to the second address register. The second address register transfers the address to the third address register in response to one of the end-of-write signal and the write clock signal. A memory array is coupled to the third address register. The third address register transfers the address to the memory array in response to the write pulse signal. A first data register stores data in response to the write clock signal. A second data register is coupled to the first data register. The first data register transfers the data to the second address register in response to one of the end-of-write signal and the write clock signal. A write driver is coupled to the second data register. The second address register transfers the data to the write driver in response to the write pulse signal, and the write driver delivers the data to the memory array.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

Figure 1:
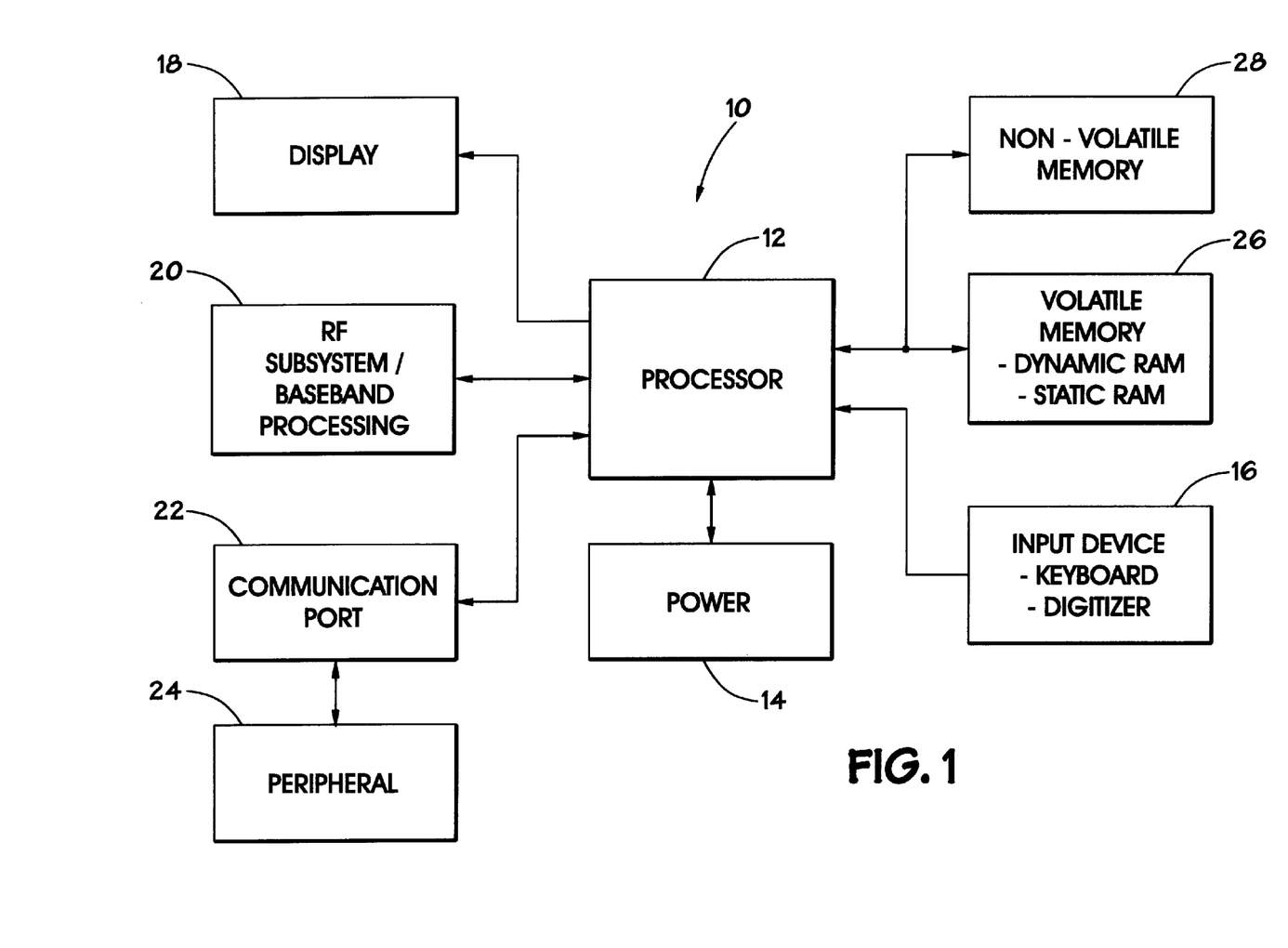
FIG. 1 illustrates a block diagram of an exemplary processor-based device.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The tradeoffs between DRAM and SRAM have generally been described above. The processor 12 may also be coupled to non-volatile memory 28. The non-volatile memory 28 may include a read only memory (ROM), such as an EPROM, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

As is clear from the above discussion, a processor-based device 10 may take many forms. However, generally speaking, any processor-based device operates in a more efficient manner when it is able to operate faster. Because a typical processor-based device 10 relies heavily upon access to volatile memory 26, one way of enhancing the speed at which the device 10 operates is by increasing the speed at which it can access the volatile memory 26. The figures described below illustrate exemplary memory devices that operate in a fashion which reduces access times as compared with similar known memories. In these embodiments, the memory devices are illustrated as synchronous SRAMs. It should be understood that the basic structure and operation described below is currently believed to be particularly useful on random memories like SRAMs and DRAMs, although any synchronous memory may benefit from these teachings. In fact, it is currently believed that these teachings may benefit any memory where address and data are written at the same time, including somewhat asynchronous memories that allow buffered write cycles.

Although cycle time typically equals access time in a synchronous SRAM, cycle time may actually be less than access time. In SRAMs of this type, delays may be introduced in delivering or "setting up" data and/or addresses to the memory array. For example, in the 4 megabyte arrays set forth in the examples below, it may take approximately 1.5 to 2.0 nanoseconds to move the data from the data I/O bus to the array. The embodiments described below depict exemplary memory devices that facilitate the set up of data and/or address information to the array to reduce or eliminate such delays. The reduction or elimination of such delays enhances the speed at which the memory may be accessed. Although particular situations may differ, it is currently believed that the reduction or elimination of these delays will increase access time by about one "speed grade." In other words, a memory device that would otherwise operate at 6 nanoseconds, for example, would be able to operate at 5 nanoseconds.

Figure 2:
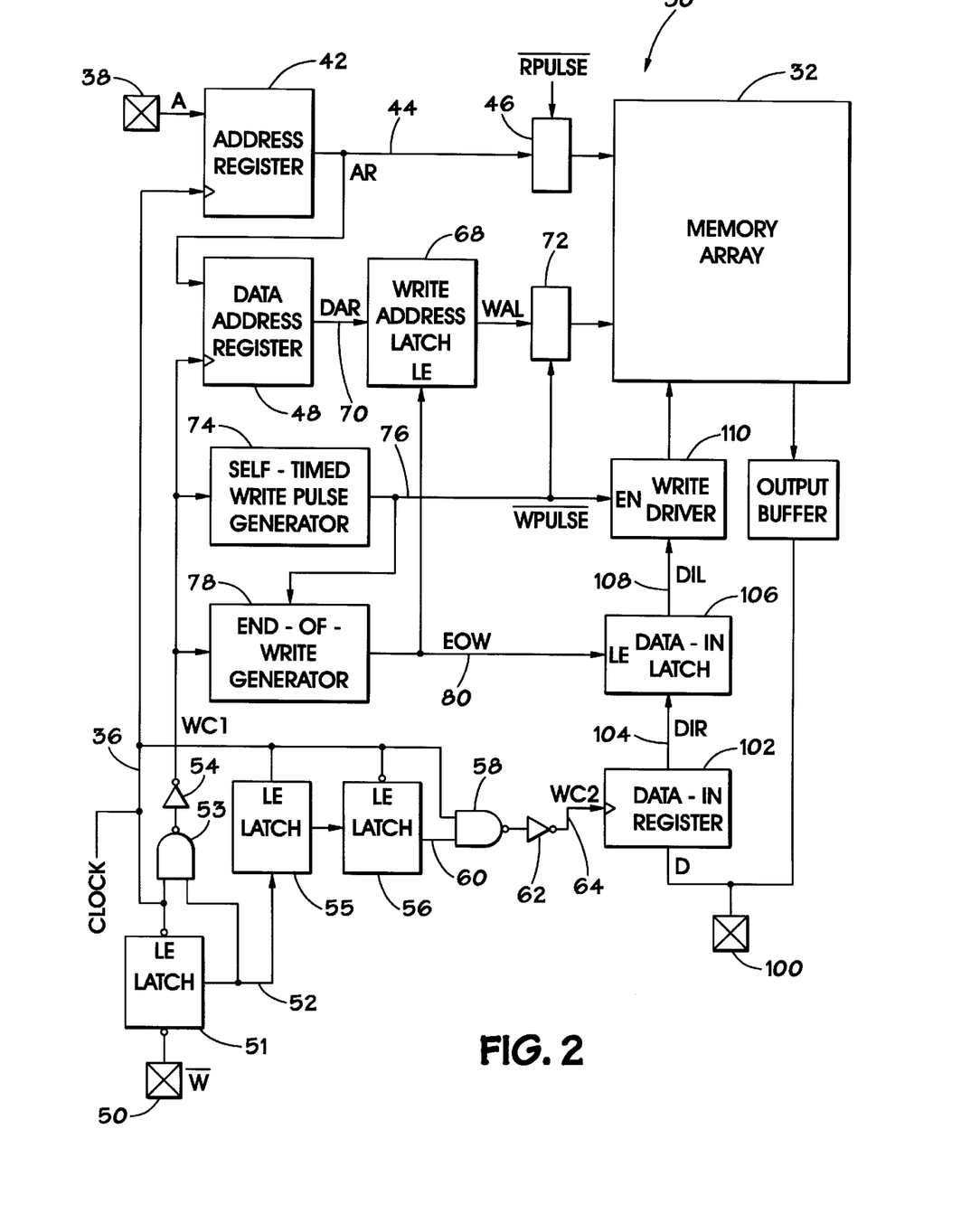
FIG. 2 illustrates a block diagram of a first embodiment of a memory circuit in accordance with the present invention.
Figure 3:
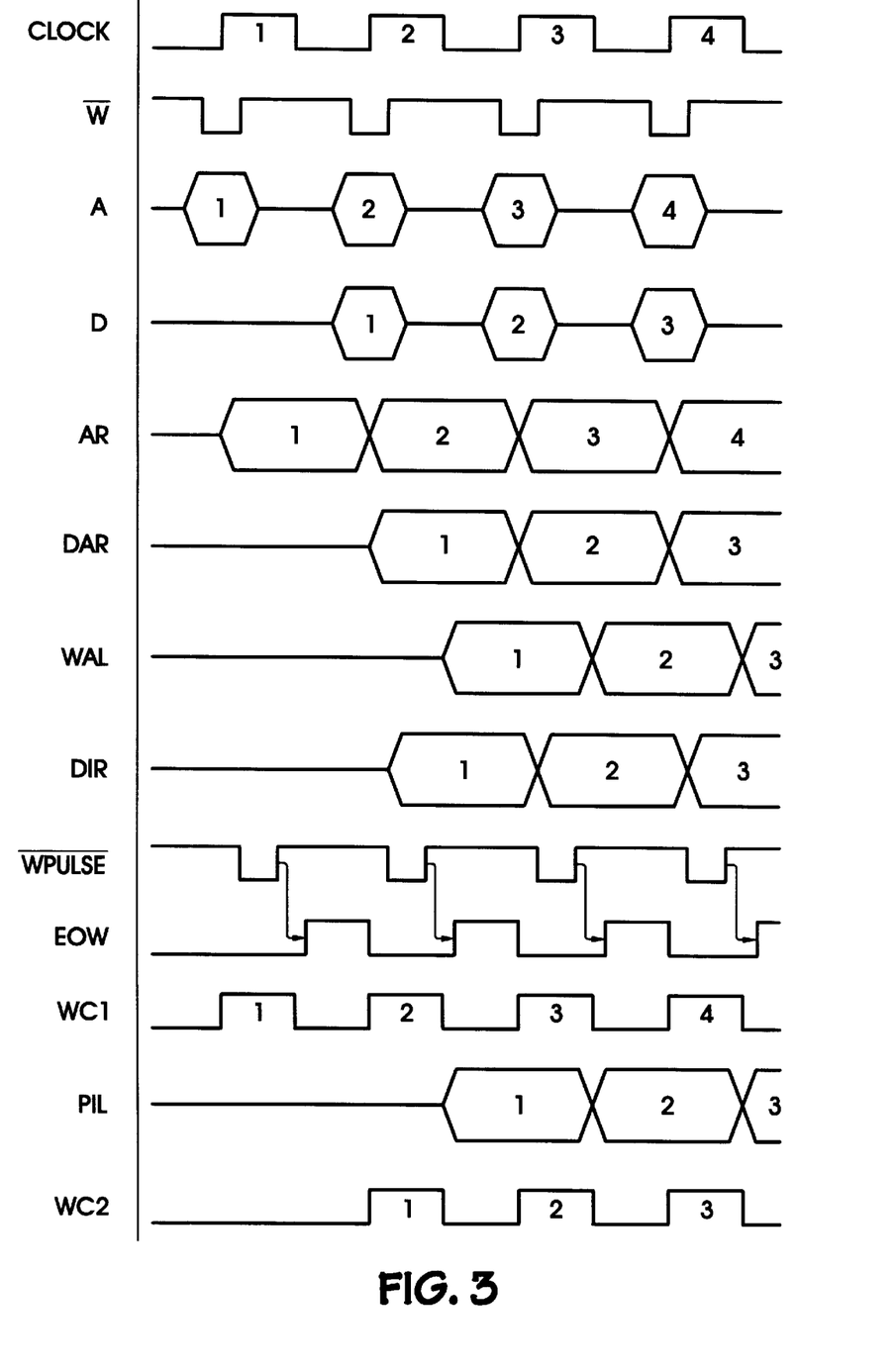
FIG. 3 illustrates various signal diagrams corresponding to the operation of the circuit illustrated in FIG. 2.

The first embodiment of a memory device 30 is illustrated in FIG. 2, and various signals that may be present during the operation of the memory device 30 are illustrated in FIG. 3. It should be noted that signals set forth below in bold type are logical compliments of the listed signal. The memory device 30 includes a memory array 32, along with various circuitry designed to process and deliver address information and data to the memory array 32. A periodic clock signal CLOCK is delivered to the memory device 30 via a line 36 to facilitate synchronous operation of the memory device 30. The address is delivered to the memory device 30 via a bus 38. An address register 42 is coupled to the bus 38 to receive the address information, and the address register 42 is also coupled to the line 36 to receive the clock signal CLOCK. As illustrated by the address waveform A, the address information is made available shortly before the rising edge of each clock signal until shortly after the rising edge of each clock signal. The rising edge of each clock signal CLOCK triggers the address register 42 to store the address information available on the bus 38.

The address information available on the bus 38 may indicate the address of the memory array 32 to which data is to be written, or it may indicate the address of the array 32 to which information or data is to be read. This address signal AR is delivered to line 44 so that it may be treated as a read address or a write (data) address, as appropriate. In the event that the address signal AR is a read address, line 44 is coupled to a gate 46 which is coupled to receive a read signal RPULSE (not shown). In response to receiving the read signal RPULSE, the gate 46 delivers the read address to the array 32.

Before discussing the manner in which the memory device handles a write address, it should be noted that the device 30 generates two write clock signals—a first write clock signal WC1 and a second write clock signal WC2. These write clock signals are generated as follows. In response to receiving the write signal w on line 50, a first write latch 51, which also receives the clock signal CLOCK, delivers a signal on line 52 no later than the rising edge of the clock signal. A NAND gate 53 receives the signal from line 52 and also receives the clock signal CLOCK on line 36. The signal from the output of the NAND gate 53 is delivered to an inverter 54, and the output of the inverter 54 delivers the first write clock signal WC1. As illustrated in FIG. 3, the first write clock signal WC1 is a signal which rises slightly later than the clock signal CLOCK and which is of the same duration.

The second write clock signal WC2 is generated by delivering the signal from line 52 to a second write latch 55 which also receives the clock signal CLOCK. The latch 55 delivers the signal which is stored in a latch 56 until the falling edge of the next clock signal CLOCK. The output of the latch 56 is delivered to a NAND gate 58 on a line 60. The NAND gate 58 also receives the clock signal CLOCK on line 36. The signal from the output of the NAND gate 58 is delivered to an inverter 62, and the output of the inverter 62 is delivered to a line 64. The signal on line 64 is called the second write clock signal WC2. As illustrated in FIG. 3, the second write clock signal WC2 is a signal with a one cycle delay which rises slightly later than the clock signal CLOCK and which is of the same duration.

In the event that the address signal AR is a write address, the line 44 is also coupled to a data address register 48. The data address register 48 is also coupled to receive the first write clock signal WC1. As illustrated by the address signal DAR, the address is latched into the data address register 48 with the rising edge of the first write clock signal WC1. The data address register 48 stores the address signal AR present on line 44 and delivers the data address DAR to a write address latch 68 via line 70. The write address latch 68 is enabled by an end-of-write signal EOW. As discussed below, the end-of-write signal EOW is generated to denote the end of a write cycle. Thus, the write address latch 68 stores the data address DAR immediately after the previous write cycle has ended. Once the write address latch 68 stores the data address DAR, it delivers a data address signal WAL to a gate 72, which is controlled by a write pulse WPULSE. Upon receiving the write pulse WPULSE, the gate 72 delivers the data address WAL to the array 32. Just after the expiration of the write pulse WPULSE, the end-of-write signal EOW enables the write address latch 68 to receive the next write address from the data address register 48 as described above.

The write pulse WPULSE is an internal signal generated by a self-timed write pulse generator 74. The write pulse generator 74 receives the first write clock signal WC1 and produces the write pulse WPULSE, as illustrated in FIG. 3. The write pulse WPULSE is delivered to line 76, which is coupled to an end-of-write generator 78. The end-of-write generator 78 also receives the clock signal CLOCK. In response to these two signals, the end-of-write generator 78 generates an end-of-write signal EOW, as illustrated in FIG. 3. The end-of-write signal EOW is delivered via line 80 to the latch enable input of the write address latch 68 to initiate the functions described above. It should be noted that there is a small time lag between the trailing edge of the write pulse WPULSE and the starting edge of the end-of-write signal EOW.

While the address to which the data is to be written is being set up to the memory array 32 from the address bus 38, the data to be written to the array 32 is being set up between a data I/O bus 100 and the memory array 32. As illustrated by the waveform D in FIG. 3, the data signal D appears on the data I/O bus 100 shortly before the rising edge of the second write clock signal WC2 following the clock signal which triggers delivery of the corresponding address signal A until shortly after the rising edge of the second write clock signal WC2. The data on the data I/O bus 100 is triggered into a data-in register 102 by the second write clock signal WC2. The data from the data-in register 102 appears on line 104 as the data signal DIR, which is illustrated in FIG. 3. Upon receiving the end-of-write signal EOW on line 80, a data-in latch 106 receives the data signal DIR. The data signal DIR in the data-in latch 106 is delivered to line 108 as the data signal DIL, as illustrated in FIG. 3. The data signal DIL is delivered to a write driver 110.

It should be noted that the write driver 110 receives the write pulse WPULSE on line 76. Thus, as illustrated in FIG. 3, the address signal WAL and the data signal DIL are available before, during, and after a respective write pulse WPULSE which triggers the delivery of both the address and the data to the array 32. After the data is written to the array 32, the array 32 is equalized, a process that may take approximately 1.0 to 1.5 nanoseconds for a 4 megabyte array and that may take longer for larger arrays. Once the array is equalized, the next address and the next data are available to the array 32 at the beginning of the next write cycle, so that the next write operation can occur early in the next write cycle without incurring the set up delays mentioned earlier. This advantage not only decreases access time, it also allows generous recovery time for equalization of the array 32.

As described in detail above, the memory device 30 illustrated in FIG. 2 provides relaxed write timing for the set up of both the address and the data to the memory array 32. However, a similar technique may be utilized to provide relaxed write timing to set up the address without prior set up of data, or to provide relaxed write timing to set up data without prior set up of the address. The former situation is described below with reference to FIGS. 4 and 5, while the latter situation is described below with reference to FIGS. 6 and 7.

Figure 4:
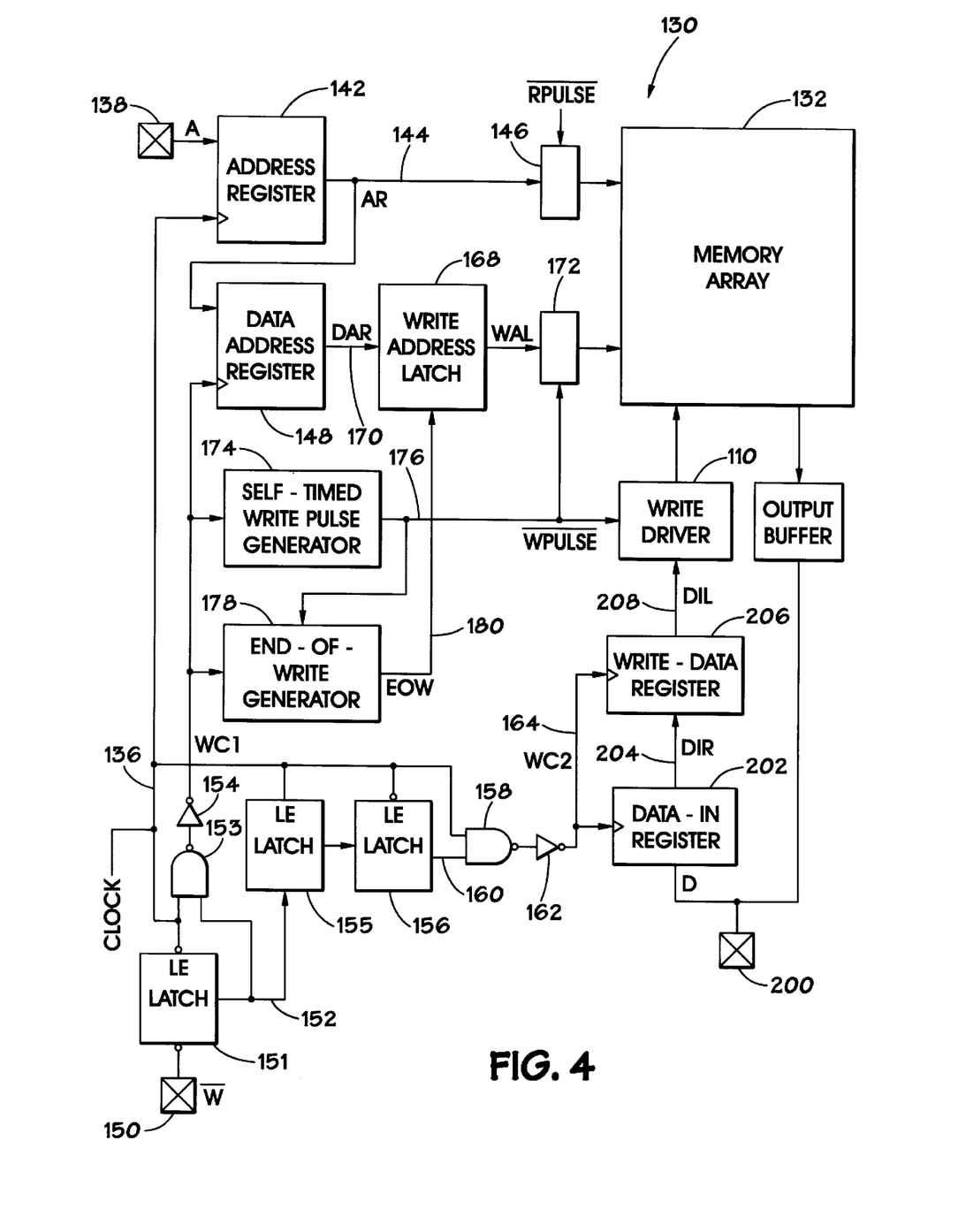
FIG. 4 illustrates a block diagram of a second embodiment of a memory circuit in accordance with the present invention.
Figure 5:
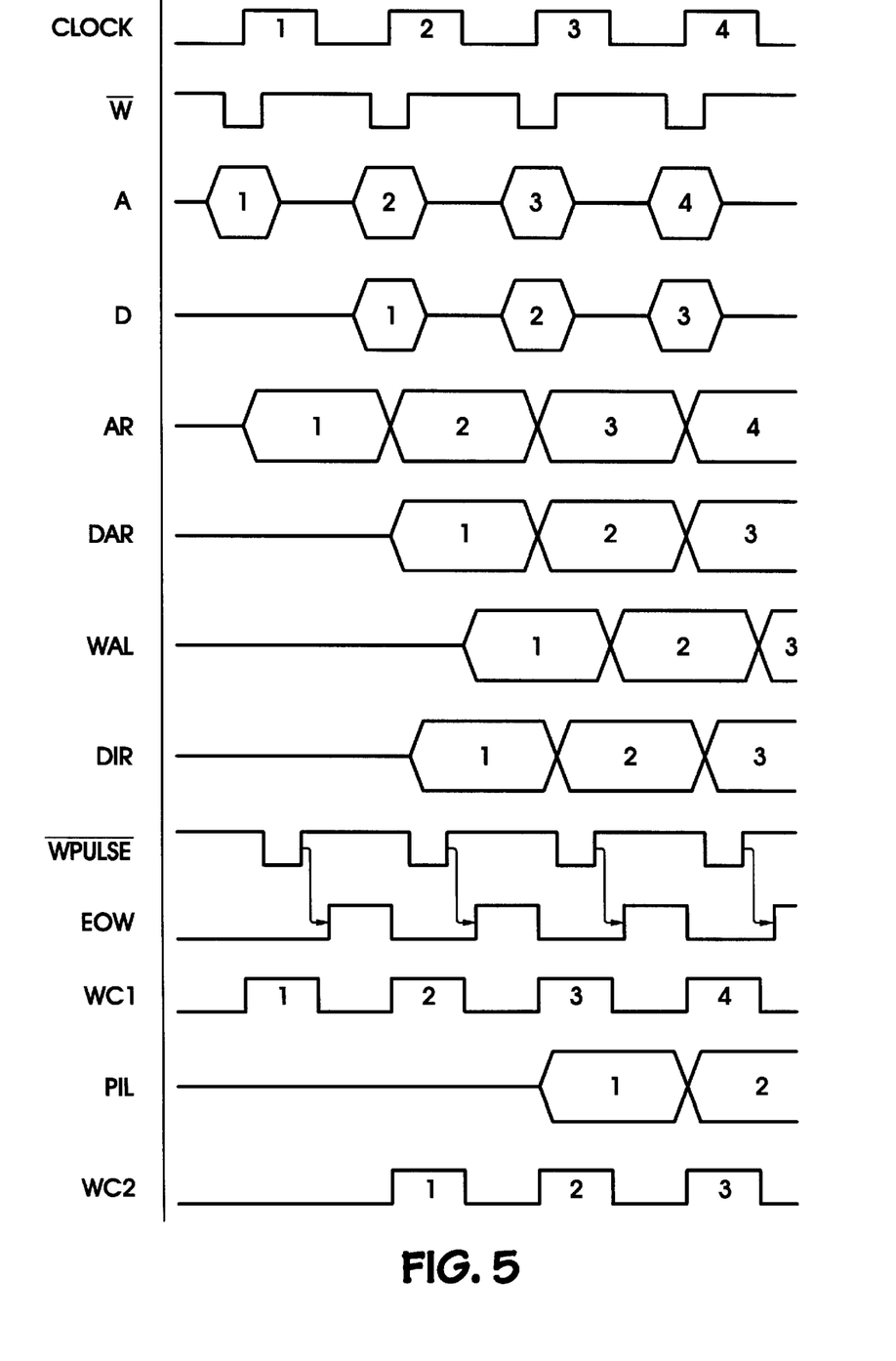
FIG. 5 illustrates various signal diagrams corresponding to the operation of the circuit illustrated in FIG. 4.

The second embodiment of a memory device 130 is illustrated in FIG. 4, and the various signals that may be present during the operation of the memory device 130 are illustrated in FIG. 5. The address is set up in essentially the same manner as discussed above with reference to FIGS. 2 and 3, but, in the interest of completeness, the functioning of the entire memory device 130 will be discussed below.

The memory device 130 includes a memory array 132, along with various circuitry designed to process and deliver address information and data to the memory array 132. A periodic clock signal CLOCK is delivered to the memory device 130 via a line 136 to facilitate synchronous operation of the memory device 130. The address is delivered to the memory device 130 via a bus 138. An address register 142 is coupled to the bus 138 to receive the address information, and the address register 142 is also coupled to the line 136 to receive the clock signal CLOCK. As illustrated by the address waveform A, the address information is made available shortly before the rising edge of each clock signal until shortly after the rising edge of each clock signal. The rising edge of each clock signal CLOCK triggers the address register 142 to store the address information available on the bus 138.

The address information available on the bus 138 may indicate the address of the memory array 132 to which data is to be written, or it may indicate the address of the array 132 to which information or data is to be read. This address signal AR is delivered to line 144 so that it may be treated as a read address or a write (data) address, as appropriate. In the event that the address signal AR is a read address, line 144 is coupled to a gate 146 which is coupled to receive a read signal RPULSE (not shown). In response to receiving the read signal RPULSE, the gate 146 delivers the read address to the array 132.

Before discussing the manner in which the memory device handles a write address, it should be noted that the device 130 generates two write clock signals—a first write clock signal WC1 and a second write clock signal WC2. These write clock signals are generated as follows. In response to receiving the write signal w on line 150, a first write latch 151, which also receives the clock signal CLOCK, delivers a signal on line 152 no later than the rising edge of the clock signal. A NAND gate 153 receives the signal from line 152 and also receives the clock signal CLOCK on line 136. The signal from the output of the NAND gate 153 is delivered to an inverter 154, and the output of the inverter 154 delivers the first write clock signal WC1. As illustrated in FIG. 5, the first write clock signal WC1 is a signal which rises slightly later than the clock signal CLOCK and which is of the same duration.

The second write clock signal WC2 is generated by delivering the signal from line 152 to a second write latch 155 which also receives the clock signal CLOCK. The latch 155 delivers the signal which is stored in a latch 156 until the falling edge of the next clock signal CLOCK The output of the latch 156 is delivered to a NAND gate 158 on a line 160.

The NAND gate 158 also receives the clock signal CLOCK on line 136. The signal from the output of the NAND gate 158 is delivered to an inverter 162, and the output of the inverter 162 is delivered to a line 164. The signal on line 164 is called the second write clock signal WC2. As illustrated in FIG. 5, the second write clock signal WC2 is a signal with a one cycle delay which rises slightly later than the clock signal CLOCK and which is of the same duration.

In the event that the address signal AR is a write address, the line 144 is also coupled to a data address register 148. The data address register 148 is also coupled to receive the first write clock signal WC1. As illustrated by the address signal DAR, the address is latched into the data address register 148 with the rising edge of the first write clock signal WC1. The data address register 148 stores the address signal AR present on line 144 and delivers the data address DAR to a write address latch 168 via line 170. The write address latch 168 is enabled by an end-of-write signal EOW. As discussed below, the end-of-write signal EOW is generated to denote the end of a write cycle. Thus, the write address latch 168 stores the data address DAR immediately after the previous write cycle has ended. Once the write address latch 168 stores the data address DAR, it delivers a data address signal WAL to a gate 172, which is controlled by a write pulse WPULSE. Upon receiving the write pulse WPULSE, the gate 172 delivers the data address WAL to the array 132. Just after the expiration of the write pulse WPULSE, the end-of-write signal EOW enables the write address latch 168 to receive the next write address from the data address register 148 as described above.

The write pulse WPULSE is an internal signal generated by a self-timed write pulse generator 174. The write pulse generator 174 receives the first write clock signal WC1 and produces the write pulse WPULSE, as illustrated in FIG. 5. The write pulse WPULSE is delivered to line 176, which is coupled to an end-of-write generator 178. The end-of-write generator 178 also receives the clock signal CLOCK. In response to these two signals, the end-of-write generator 178 generates an end-of-write signal EOW, as illustrated in FIG. 5. The end-of-write signal EOW is delivered via line 180 to the latch enable input of the write address latch 168 to initiate the functions described above. It should be noted that there is a small time lag between the trailing edge of the write pulse WPULSE and the starting edge of the end-of-write signal EOW.

While the address to which the data is to be written is being set up to the memory array 132 from the address bus 138, the data to be written to the array 132 is delivered to a data I/O bus 200. As illustrated by the waveform D in FIG. 5, the data signal D appears on the data I/O bus 200 shortly before the rising edge of the second clock signal WC2 following the clock signal which triggers delivery of the corresponding address signal A until shortly after the rising edge of the second write clock signal WC2. As in the previous embodiment, the data on the data I/O bus 200 is triggered into a data-in register 202 by the second write clock signal WC2. The data from the data-in register 202 appears on line 204 as the data signal DIR, which is illustrated in FIG. 5.

Instead of quickly triggering storage of the data signal DIR into a data-in latch using the end-of-write signal EOW as in the first embodiment, a data-in latch 206 receives the data signal DIR at a later time in response to receiving the next second write clock signal WC2. The data signal DIR in the data-in latch 206 is delivered to line 208 as the data signal DIL, as illustrated in FIG. 5. The data signal DIL is delivered to a write driver 210. It should be noted that the write driver 210 receives the write pulse WPULSE on line 176. Thus, as illustrated in FIG. 5, the address signal WAL is available before, during, and after a respective write pulse WPULSE which triggers the delivery of both the address and the data to the array 132, but the data signal DIL is delayed. Thus, as can be seen, the address is available for delivery to the array 132 earlier than the data. In certain circumstances, the write pulse WPULSE may be delayed to allow the data signal DIL to set up. Thus, as compared with the device 30, the device 130 may, in certain circumstances, exhibit slightly slower access times.

Figure 6:
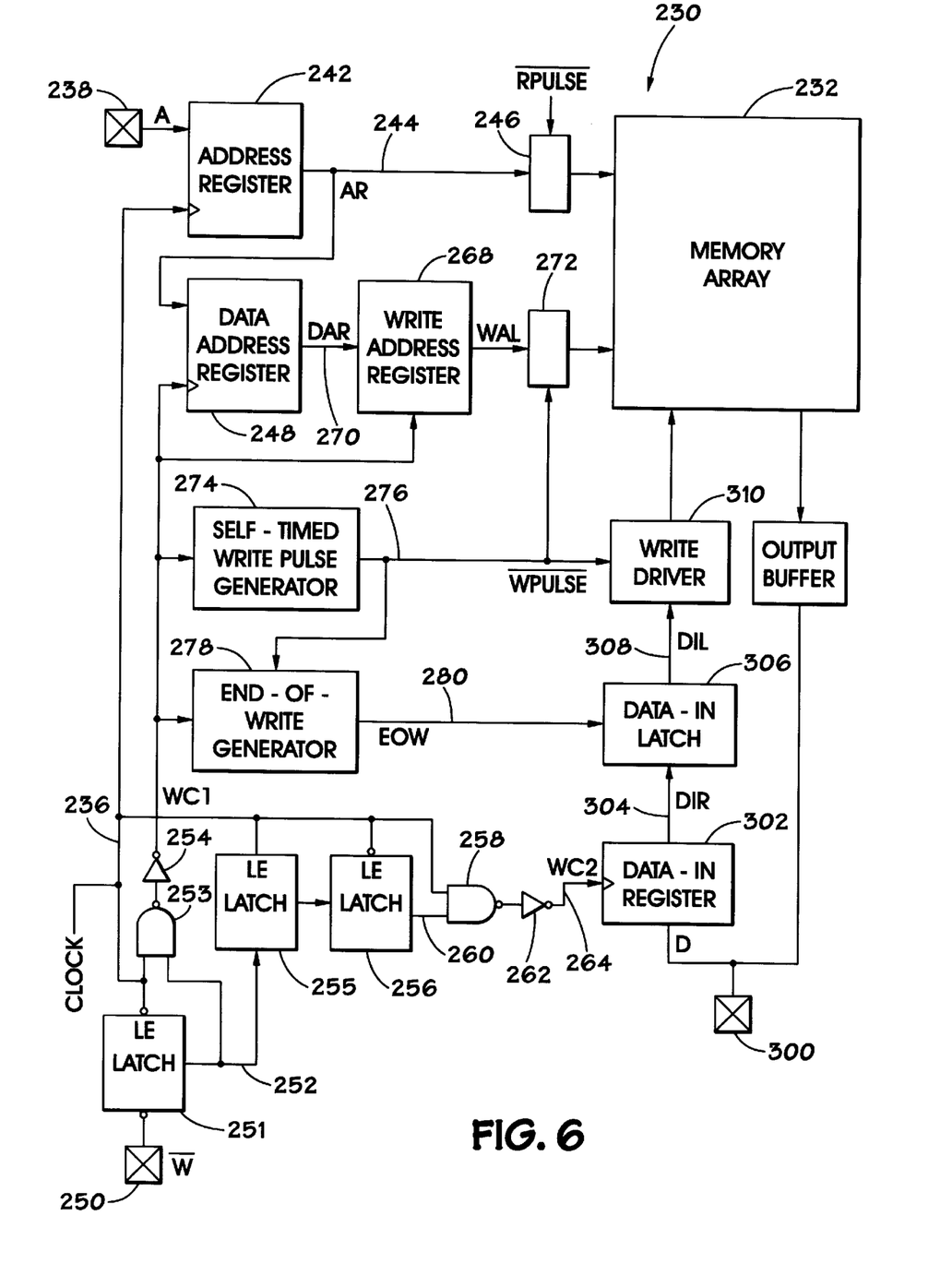
FIG. 6 illustrates a block diagram of a third embodiment of a memory circuit in accordance with the present invention.
Figure 7:
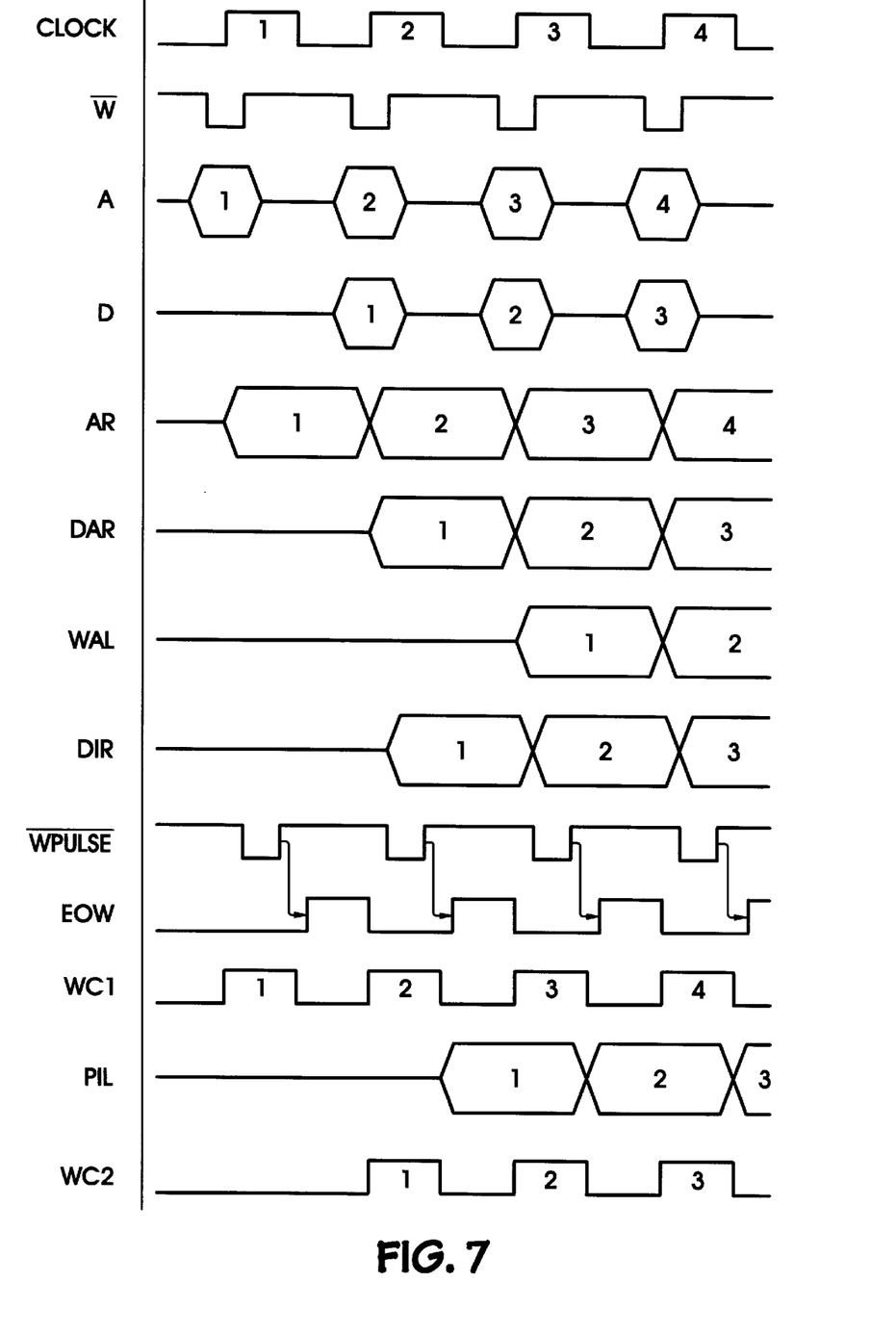
FIG. 7 illustrates various signal diagrams corresponding to the operation of the circuit illustrated in FIG. 6.

The third embodiment of a memory device 230 is illustrated in FIG. 6, and the various signals that may be present during the operation of the memory device 230 are illustrated in FIG. 7. The data is set up in essentially the same manner as discussed above with reference to FIGS. 2 and 3, but, in the interest of completeness, the functioning of the entire memory device 230 will be discussed below.

The memory device 230 includes a memory array 232, along with various circuitry designed to process and deliver address information and data to the memory array 232. A periodic clock signal CLOCK is delivered to the memory device 230 via a line 236 to facilitate synchronous operation of the memory device 230. The address is delivered to the memory device 230 via a bus 238. An address register 242 is coupled to the bus 238 to receive the address information, and the address register 242 is also coupled to the line 236 to receive the clock signal CLOCK. As illustrated by the address waveform A, the address information is made available shortly before the rising edge of each clock signal until shortly after the rising edge of each clock signal. The rising edge of each clock signal CLOCK triggers the address register 242 to store the address information available on the bus 238.

The address information available on the bus 238 may indicate the address of the memory array 232 to which data is to be written, or it may indicate the address of the array 232 to which information or data is to be read. This address signal AR is delivered to line 244 so that it may be treated as a read address or a write (data) address, as appropriate. In the event that the address signal AR is a read address, line 244 is coupled to a gate 246 which is coupled to receive a read signal RPULSE (not shown). In response to receiving the read signal RPULSE, the gate 246 delivers the read address to the array 232.

Before discussing the manner in which the memory device handles a write address, it should be noted that the device 230 generates two write clock signals—a first write clock signal WC1 and a second write clock signal WC2. These write clock signals are generated as follows.

In response to receiving the write signal w on line 250, a first write latch 251, which also receives the clock signal CLOCK, delivers a signal on line 252 on the rising edge of the clock signal. A NAND gate 253 receives the signal from line 252 and also receives the clock signal CLOCK on line 236. The signal from the output of the NAND gate 253 is delivered to an inverter 254, and the output of the inverter 254 delivers the first write clock signal WC1. As illustrated in FIG. 7, the first write clock signal WC1 is a signal which rises slightly later than the clock signal CLOCK and which is of the same duration.

The second write clock signal WC2 is generated by delivering the signal from line 252 to a second write latch 255 which also receives the clock signal CLOCK. The latch 255 delivers the signal which is stored in a latch 256 until the falling edge of the next clock signal CLOCK. The output of the latch 256 is delivered to a NAND gate 258 on a line 260. The NAND gate 258 also receives the clock signal CLOCK on line 236. The signal from the output of the NAND gate 258 is delivered to an inverter 262, and the output of the inverter 262 is delivered to a line 264. The signal on line 264 is called the second write clock signal WC2. As illustrated in FIG. 7, the second write clock signal WC2 is a signal with a one cycle delay which rises slightly later than the clock signal CLOCK and which is of the same duration.

In the event that the address signal AR is a write address, the line 244 is also coupled to a data address register 248. The data address register 248 is also coupled to receive the first write clock signal WC1. As illustrated by the address signal DAR, the address is latched into the data address register 248 with the rising edge of the first write clock signal WC1. The data address register 248 stores the address signal AR present on line 244 and delivers the data address DAR to a write address register 268 via line 270. Instead of being enabled by an end-of-write signal as in the first embodiment, the write address register 268 is enabled by the next first write clock signal WC1. Thus, instead of storing the data address early in response to an end-of-write signal, the write address register 268 does not store the data address until somewhat later, as illustrated in FIG. 7. Once the write address register 268 stores the data address DAR, it delivers a data address signal WAL to a gate 272, which is controlled by a write pulse WPULSE. Upon receiving the write pulse WPULSE, the gate 272 delivers the data address WAL to the array 232.

The write pulse WPULSE is an internal signal generated by a self-timed write pulse generator 274. The write pulse generator 274 receives the first write clock signal WC1 and produces the write pulse WPULSE, as illustrated in FIG. 7. The write pulse WPULSE is delivered to line 276, which is coupled to an end-of-write generator 278. The end-of-write generator 278 also receives the clock signal CLOCK. In response to these two signals, the end-of-write generator 278 generates an end-of-write signal EOW, as illustrated in FIG. 7.

While the address to which the data is to be written is being processed as described above, the data to be written to the array 232 is being set up between a data I/O bus 300 and the memory array 232 in much the same fashion as described with reference to the device 30. However, to ensure completeness, the manner in which the device 230 operates is described in detail below. As illustrated by the waveform D in FIG. 7, the data signal D appears on the data I/O bus 300 shortly before the rising edge of the second write clock signal WC2 following the clock signal which triggers delivery of the corresponding address signal A until shortly after the rising edge of the second write clock signal WC2. The data on the data I/O bus 300 is triggered into a data-in register 302 by the second write clock signal WC2. The data from the data-in register 302 appears on line 304 as the data signal DIR, which is illustrated in FIG. 7. Upon receiving the end-of-write signal EOW on line 280, a data-in latch 306 receives the data signal DIR. The data signal DIR in the data-in latch 306 is delivered to line 308 as the data signal DIL, as illustrated in FIG. 7. The data signal DIL is delivered to a write driver 310.

It should be noted that the write driver 310 receives the write pulse WPULSE on line 276. As illustrated in FIG. 7, the data signal DIL is available before, during, and after a respective write pulse WPULSE which triggers the delivery of both the address and the data to the array 232, but the address signal WAL is delayed. Thus, as can be seen, the data is available for delivery to the array 232 earlier than the address. In certain circumstances, the write pulse WPULSE may be delayed to allow the address signal WAL to set up. Thus, as compared with the device 30, the device 230 may, in certain circumstances, exhibit slightly slower access times.

While the invention may be susceptible to various modifications and alternative forms, specific embodiments have been shown by way of example in the drawings and have been be described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of accessing a memory array of a memory device, the method comprising the steps of:
    (a) generating a write clock signal in response to a system clock signal and a write signal;
    (b) generating a write pulse signal in response to the write clock signal;
    (c) generating an end-of-write signal in response to the write clock signal and the write pulse signal;
    (d) storing an address in a first address register in response to the system clock signal;
    (e) transferring the address from the first address register to a second address register in response to the write clock signal;
    (f) transferring the address from the second address register to a third address register in response to one of the end-of-write signal and the write clock signal;
    (g) delivering the address from the third address register to the memory array in response to the write pulse signal;
    (h) storing data in a first data register in response to the write clock signal;
    (i) transferring the data from the first data register to a second address register in response to one of the end-of-write signal and the write clock signal; and
    (j) transferring the data from the second address register to a write driver in response to the write pulse signal, the write driver delivering the data to the memory array.

2. A method of accessing a memory array of a memory device, the method comprising the steps of:
    (a) generating a write clock signal in response to a system clock signal and a write signal;
    (b) generating a write pulse signal in response to the write clock signal;
    (c) generating an end-of-write signal in response to the write clock signal and the write pulse signal;
    (d) storing an address in a first address register in response to the system clock signal;
    (e) transferring the address from the first address register to a second address register in response to the write clock signal;
    (f) transferring the address from the second address register to a third address register in response to the end-of-write signal;
    (g) delivering the address from the third address register to the memory array in response to the write pulse signal;
    (h) storing data in a first data register in response to the write clock signal;
    (i) transferring the data from the first data register to a second address register in response to the end-of-write signal; and
    (j) transferring the data from the second address register to a write driver in response to the write pulse signal, the write driver delivering the data to the memory array.

3. A method of accessing a memory array of a memory device, the method comprising the steps of:
    (a) generating a write clock signal in response to a system clock signal and a write signal;
    (b) generating a write pulse signal in response to the write clock signal;
    (c) generating an end-of-write signal in response to the write clock signal and the write pulse signal;
    (d) storing an address in a first address register in response to the system clock signal;
    (e) transferring the address from the first address register to a second address register in response to the write clock signal;
    (f) transferring the address from the second address register to a third address register in response to the end-of-write signal;
    (g) delivering the address from the third address register to the memory array in response to the write pulse signal;
    (h) storing data in a first data register in response to the write clock signal;
    (i) transferring the data from the first data register to a second address register in response to the write clock signal; and
    (j) transferring the data from the second address register to a write driver in response to the write pulse signal, the write driver delivering the data to the memory array.

4. A method of accessing a memory array of a memory device, the method comprising the steps of:
    (a) generating a write clock signal in response to a system clock signal and a write signal;
    (b) generating a write pulse signal in response to the write clock signal;
    (c) generating an end-of-write signal in response to the write clock signal and the write pulse signal;
    (d) storing an address in a first address register in response to the system clock signal;
    (e) transferring the address from the first address register to a second address register in response to the write clock signal;
    (f) transferring the address from the second address register to a third address register in response to the write clock signal;
    (g) delivering the address from the third address register to the memory array in response to the write pulse signal;
    (h) storing data in a first data register in response to the write clock signal;
    (i) transferring the data from the first data register to a second address register in response to the end-of-write signal; and
    (j) transferring the data from the second address register to a write driver in response to the write pulse signal, the write driver delivering the data to the memory array.

5. A memory device comprising:
    a write clock signal generator delivering a write clock signal in response to a system clock signal and a write signal;
    a write pulse generator delivering a write pulse signal in response to the write clock signal;

an end-of-write signal generator delivering an end-of-write signal in response to the write clock signal and the write pulse signal;

a first address register for storing an address in response to the system clock signal;

a second address register coupled to the first address register, the first address register transferring the address to the second address register in response to the write clock signal;

a third address register coupled to the second address register, the second address register transferring the address to the third address register in response to one of the end-of-write signal and the write clock signal;

a memory array coupled to the third address register, the third address register transferring the address to the memory array in response to the write pulse signal; a first data register for storing data in response to the write clock signal;

a second data register coupled to the first data register, the first data register transferring the data to the second address register in response to one of the end-of-write signal and the write clock signal; and a write driver coupled to the second data register, the second address register transferring the data to the write driver in response to the write pulse signal, the write driver delivering the data to the memory array.

6. A processor-based device comprising:

a processor;

a memory device coupled to the processor, the memory device comprising:

a write clock signal generator delivering a write clock signal in response to a system clock signal and a write signal;

a write pulse generator delivering a write pulse signal in response to the write clock signal;

an end-of-write signal generator delivering an end-of-write signal in response to the write clock signal and the write pulse signal;

a first address register for storing an address in response to the system clock signal;

a second address register coupled to the first address register, the first address register transferring the address to the second address register in response to the write clock signal;

a third address register coupled to the second address register, the second address register transferring the address to the third address register in response to one of the end-of-write signal and the write clock signal;

a memory array coupled to the third address register, the third address register transferring the address to the memory array in response to the write pulse signal;

a first data register for storing data in response to the write clock signal;

a second data register coupled to the first data register, the first data register transferring the data to the second address register in response to one of the end-of-write signal and the write clock signal; and a write driver coupled to the second data register, the second address register transferring the data to the write driver in response to the write pulse signal, the write driver delivering the data to the memory array.

* * * * *